United States Patent [19]

Ackmann et al.

[11] Patent Number: 4,508,815
[45] Date of Patent: Apr. 2, 1985

[54] RECESSED METALLIZATION

[75] Inventors: Paul W. Ackmann, Lewisville; Frank R. Bryant, Denton, both of Tex.

[73] Assignee: Mostek Corporation, Carrollton, Tex.

[21] Appl. No.: 548,465

[22] Filed: Nov. 3, 1983

[51] Int. Cl.³ ................ H01L 21/312; H01L 21/283
[52] U.S. Cl. .................... 430/314; 156/643; 156/644; 156/661.1; 156/653; 427/88; 427/89; 427/90; 427/96; 427/259; 430/316; 430/317; 430/319
[58] Field of Search ........... 427/89, 90, 88, 96, 427/259; 430/314, 316, 317, 319; 156/643, 644, 661.1, 653

[56] References Cited

U.S. PATENT DOCUMENTS

| 4,354,897 | 10/1982 | Nakajima | 156/644 |
| 4,378,383 | 3/1983 | Moritz | 427/88 |
| 4,439,270 | 3/1984 | Powell | 156/653 |

OTHER PUBLICATIONS

Perfect Planar Technology For VLSI'S, K. Ehara, et al., 1982 Symposium on VLSI.
Metal Lift-Off Process with a Self-Aligned Insulation Planarization, A. Hoeg, et al., IBM Technical Disclosure Bulletin, vol. 24, No. 9, Feb. 1982.

Primary Examiner—John D. Smith
Attorney, Agent, or Firm—Eric W. Petraske

[57] ABSTRACT

An improved method of planarizing a level of metallization employs a trench in a smooth-surfaced dielectric and a sequence of etching steps to cut the trench locally down to the substrate, while forming the main metallization pattern at the same time.

4 Claims, 12 Drawing Figures

RECESSED METALLIZATION

DESCRIPTION

1. Technical Field

The field of the invention is that of integrated circuits having a layer of metal superimposed on a layer of insulation.

2. Background Art

In fabricating integrated circuits, it is necessary to place a layer of material on top of an irregular surface having sharp or abrupt steps. A recurrent problem in the field has been that of forming a layer that extends continuously over such steps. Many techniques in the art are known to make intermediate layers smoother so that later—applied layers will cover the surface properly.

When a circuit uses double-level metallization, the first layer of metal is in the form of a series of strips standing up above an insulating layer. An intermediate insulating layer is placed about the first layer of metal and a second layer of metal is placed on top of it. It is important that the intermediate insulating layer maintain its integrity to avoid short circuits or signal feedthrough between the two layers of metal. It is also important that the second metallic level be continous as it passes over the step in the insulating layer that is caused by the projection of the first metal level. A number of techniques are known in the art to make the surface of the intermediate insulator more smooth, but they all have the drawback that they require extended processing and/or new equipment. Even with extra processing steps and equipment, double level metallized circuits are still prone to reliability problems.

A technique commonly used in the art is that of applying a thick layer of phosphorous-doped glass on an integrated circuit, then heating and flowing the glass to provide a smoother surface. Contacts are opened through the glass in a conventional process, and the surface of the circuit is covered with a layer of metal. The metal is then etched away, leaving the desired pattern of metal strips for the first layer of metallization. The intervening insulating material is then placed over the first level of metal and the second level of metal is placed on top of it.

One prior art method of producing a level surface on the first level of metallization is shown in an article by A. J. Hoeg et al in the IBM Technical Disclosure Bulletin, Vol. 24, No. 9, page 4839, 1982. In this process, a metal strip is set into a wide aperture in a nitride layer and a repetitive series of fill-in steps is performed to build up a gap that is produced on either side of the metal, in order to form a smooth surface.

Another article, by G. T. Chiu et al in the IBM Technical Disclosure Bulletin, Vol. 25, No. 10, page 5309, 1983, shows two-level metallization that uses the result of the first method as a starting point.

SUMMARY OF THE INVENTION

The invention relates to an improved metallization process in which a relatively thick layer of glass or other dielectric is formed over the lower components of the integrated circuit and channels are cut into the dielectric to receive the first level of metal so that the first level of metal is effectively embedded in the dielectric layer. A second insulating or other layer may then be applied over a relatively smooth surface on the top of the first level metal.

BEST MODE OF CARRYING OUT THE INVENTION

Figure 1:
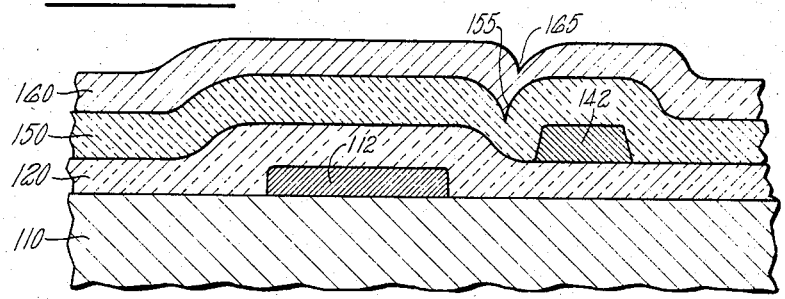
FIG. 1 illustrates a cross section of a prior art double level circuit.

In order to clarify the problem solved by the invention, reference is made to FIG. 1, showing in cross section a substrate 110 having imposed on it a silicon gate 112 covered by insulating layer 120. A section of a first metal lead 142 extending perpendicular to the plane of the paper is shown to the right of gate 112. Lead 142 is covered by an intermediate insulating layer 150 which has a step in it indicated by the numeral 155 at the corner of lead 142. A second level of metal strip, 160, extending across the drawing, reproduces step 155 as step 165. At step 155, the insulating material is relatively thin and there may be a short circuit or there may be a capacitive coupling between the two levels of metal. There may also be electromigration of impurities, caused by the high fields that are generated at sharp corners such as those at step 155. Further, at point 165, metal 160 may be discontinuous, leaving an open circuit.

A number of approaches are used in the art to make the surface of the different portions of the integrated circuit more smooth, so that it will be easier to provide properly smooth and well-formed subsequent layers. These techniques are generally referred to as planarization.

The thickness of the various layers are dictated by a number of considerations, such as providing a reasonable margin of insulation or, for metal, providing sufficient current-carrying capacity. Since the layers cannot be made arbitrarily thin, it is necessary to do something to make the top surface of lower layers more smooth (or more planar) in order to provide a proper base for subsequent layers.

The subject process may be summarized as:

(a) depositing a relatively thick layer of dielectric, such as a reflow phosphorus-doped glass;

(b) applying, exposing and developing a photoresist to the pattern of the contacts that are to be opened through the glass to lower elements of the circuit;

(c) plasma etching the contact apertures partially through the glass;

(d) stripping the contact photoresist;

(e) heating the glass to increase its density and to smooth out the edges of the contact apertures;

(f) applying, exposing and developing a metallization photoresist with a pattern that permits etching into the glass where the metal is to be applied;

(g) plasma etching and wet etching in combination a pattern of channels in the glass that correspond to the desired location of the first metal layer;

(h) continuing the channel etching until the contact apertures are etched down to the substrate so that the apertures are free of oxide;

(i) evaporating or sputtering metal over the surface of the wafer; and (j) stripping the metallization photoresist, thereby lifting off the layer of metal that is outside the channels and leaving the first metallic layer embedded in the channels in the dielectric.

The wafer is now ready for the application of the intermediate insulating material which will be applied over a surface that is considerably smoother than that provided by the prior art processes.

Figure 2A:
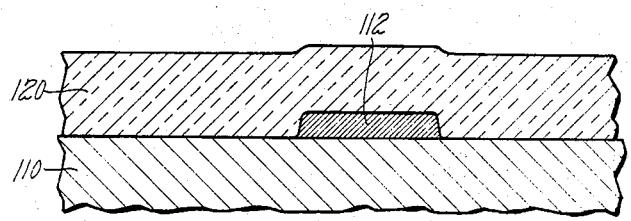
FIGS. 2A and 2B illustrate preliminary steps of forming apertures for electrical contacts.

Referring now to FIG. 2, FIG. 2A shows a cross section of a portion of an integrated circuit in which silicon gate 112 rests on substrate 110 separated by a gate oxide that is not shown in the picture. Insulator may be a layer of phosphorus-doped reflow glass. There is a slight bulge in glass 120 above gate 112, indicating the smoothing effect of the thicker reflow.

Figure 2B:
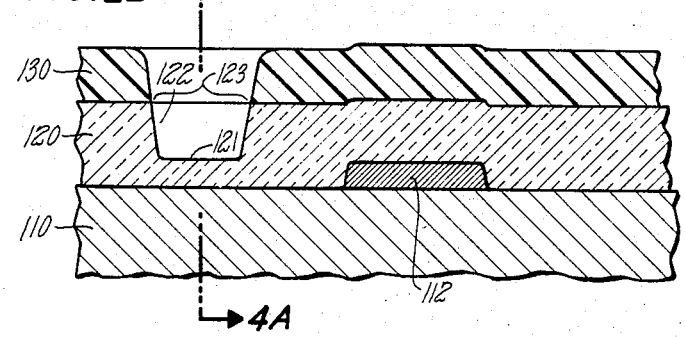

FIG. 2B illustrates the same portion of the circuit shown in FIG. 2A after the step of etching the first stage of the contact aperture. Photoresist layer 130 has been deposited above glass layer 120 and aperture 122 has been etched partially into glass layer 120 either by wet or plasma etching. Aperture 122 has a bottom surface indicated by the numeral 121 and a width, indicated by the numeral 123.

Figure 3A:
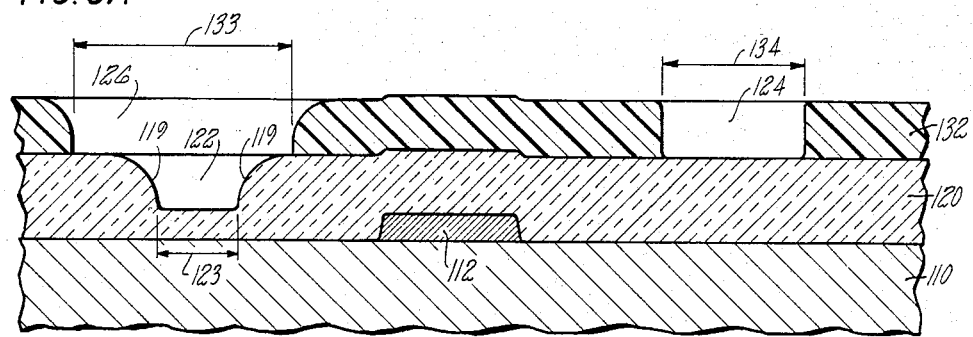
FIGS. 3A, B, C, D, and E illustrate various steps of the invention.

After the initial stage of the contact opening process, photoresist 130 is stripped and the glass is heated in order to increase its density and also to provide the rounded edges 119 of contact aperture 122 as illustrated in FIG. 3A. It is not necessary that the dielectric in which the first level of metal is inset be glass and the densifying step would be omitted for a different choice of dielectric. The rounded edges are not essential, although it is generally advantageous to avoid sharp corners in conductors.

A new layer of photoresist 132 is applied as shown in FIG. 3A, in which two portions of the metal pattern are shown in cross section as apertures 124 and 126. Aperture 126, having dimension 133, passes above aperture 122 so that the metal to be placed in it will make electrical contact with the contact element that will penetrate through aperture 122. Aperture 124, having dimension 134, does not have a contact in this region.

Figure 3B:
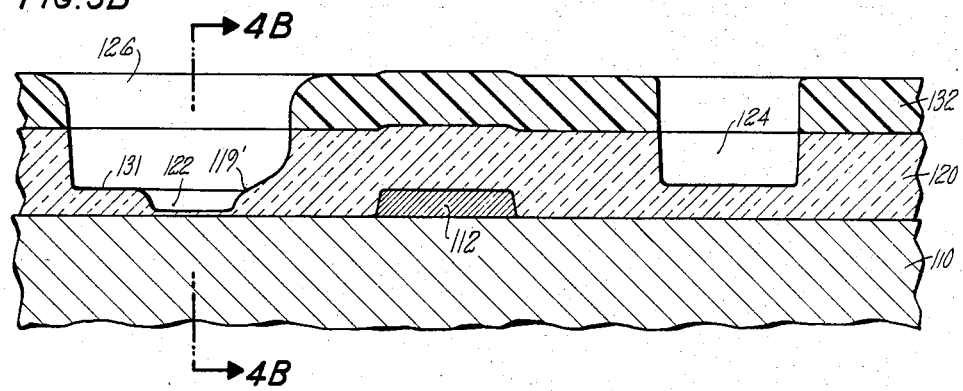

FIG. 3B illustrates the same region after the end of the plasma etching step (g) above. Apertures 126 and 122 have been plasma etched until the contact portion, shown as aperture 122', has penetrated nearly to substrate 110. In this example, aperture 122 was not cut down to substrate 110 in either the first or the second etching step, but that restriction is not essential to the practice of the invention in its most general form. If plasma etching is employed, there is a danger that substrate 110 will be attacked by the plasma if the substrate is exposed for too long. In CMOS processing, there is an additional danger that phosphorous from the glass will contaminate an exposed p+ substrate.

Figure 3C:
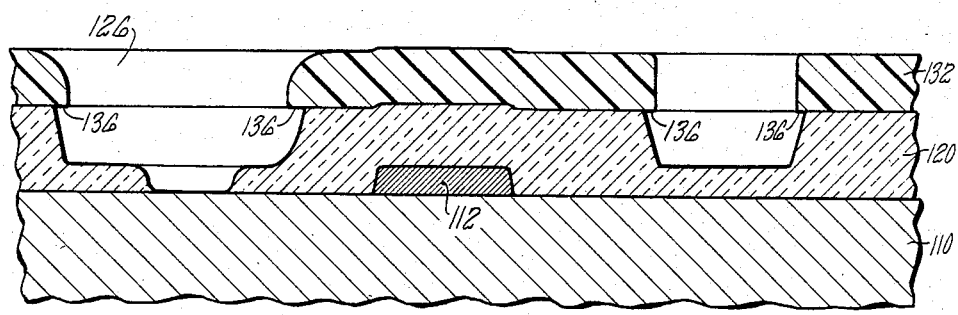

In order to protect against the possibility of substrate damage, the plasma etching is stopped and the aperture is finished by a wet etching step, but different plasmas or substrates and improved control may make this precaution unnecessary. FIG. 3C shows the finished apertures. Aperture 122 has now penetrated to substrate 110, the wet etching step being used to remove oxide from the aperture bottom. This step has also undercut photoresist 132 to produce undercuts 136 at the top glass edges of apertures 126 and 124. These undercuts 136 aid in liftoff of the first metal level by forcing a discontinuity in the metal at the edges of apertures 124 and 126.

The relative depths of the first etch to open contact apertures; the second etch to remove the bulk of the material and the finishing etch will depend on a particular design. The channels for the first metal level should not penetrate so deeply that there is coupling to electrical components below, although there may be circuits in which it does not matter if the channels penetrate deeply.

Figure 3D:
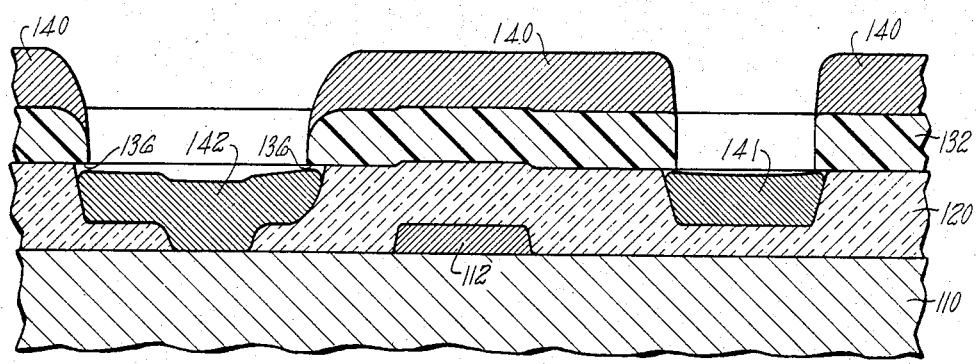

FIG. 3D shows the same area after the first metal level has been deposited. Metal layer 140 covers those areas of the wafer which are outside of the channel and layers 141 and 142 have penetrated into the channel. It has been found that successful liftoff of metal layer 140 may be done even when the thickness of layer 140 is greater than the thickness of photoresist 132. The stripping agent can penetrate through undercuts 136, even if the top and sides of the photoresist are covered by metal. For the dimensions used in contemporary practice, it has been found that an undercut dimension of more than one-half micron causes difficulty for application by evaporating or sputtering because the metal does not penetrate well into the region below the undercut so that there is a step at the edge of the channel, below undercut 136. The edges of the various apertures in photoresist 132 have been shown with different degrees of verticality, indicating visually that the quality of these nominally vertical surfaces is not important.

Metal 141 fills its channel relatively smoothly, rising to a point slightly below the top of glass layer 120. Metal layer 142 has a slight dip corresponding to the greater depth of contact aperture 122. It is not essential that the top surface of the metal layer be exactly flat, of course, nor is it essential that the top layer of metal be recessed below glass layer 120. It may project slightly above layer 120 (so long as the stripping fluid can penetrate the photoresist) and improved smoothness of the surface will still be realized compared to the prior art process.

Figure 3E:
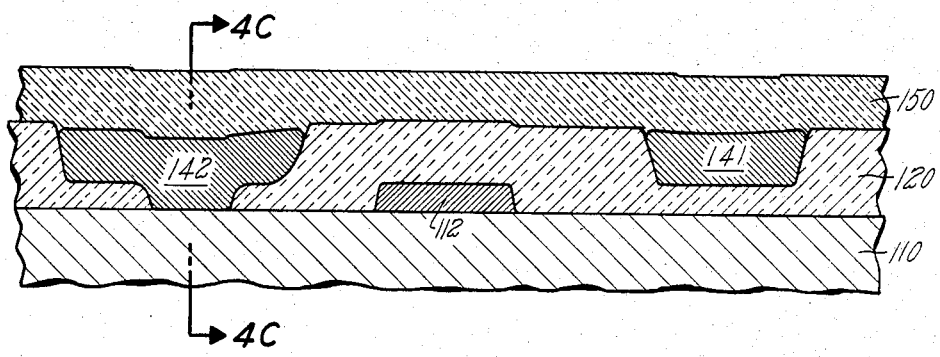

FIG. 3E shows the same area after photoresist 132 has been lifted off, taking with it the remaining portions 140 of the metallic layer. This metal liftoff process differs from a well-known prior art resist aided liftoff process (reference) in that the quality of the vertical surfaces of the photoresist apertures is not important and this metal removal stage is considerably less delicate and critical than that of the prior art. An intermediate insulating layer 150 has been deposited above glass 120 and metal layers 141 and 142. Layer 150 may be another layer of reflow glass, or any other suitable dielectric. The drawing clearly shows the relatively small steps which are produced by the present invention, compared to those of the prior art in which the step would be the full thickness of the metal layer.

Figure 4A:
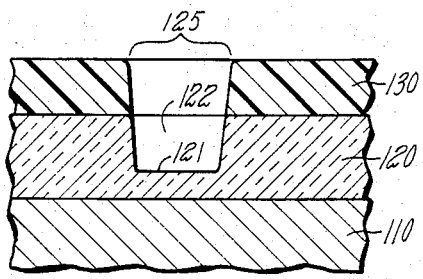
FIGS. 4A, B, C illustrate steps from FIGS. 2 and 3 from a different view.
Figure 4B:
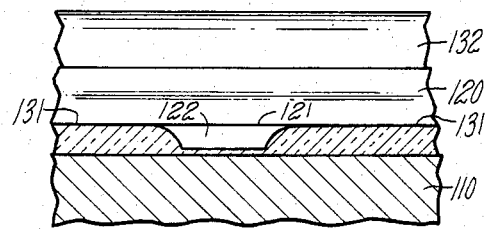
Figure 4C:
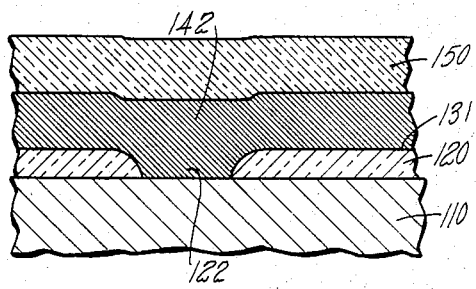

FIGS. 4A through 4C show cross sections taken through FIGS. 2B, 3B and 3E respectively, as indicated by the arrows in those figures. These FIG. 4 views look through the metal—channel layer towards silicon gate 112. FIG. 4A illustrates substrate 110 and glass layer 120, penetrated partially by aperture 122 and having a dimension 125 which is perpendicular to the plane of the paper in FIG. 2B. Dimensions 123 and 125 as drawn in FIGS. 2B and 4A are approximately equal, but any convenient shape for the contact aperture may be used.

FIG. 4B illustrates a cross section taken through FIG. 3 in which aperture 122 has now penetrated almost to substrate 110 and bottom surface 131 of the metal channel shows up as two lines extending indefinitely perpendicular to the plane of the paper in FIG. 3.

FIG. 4C shows a cross section from FIG. 3E at the end of the intermediate dielectric deposition stage, in which metal level 142 now fills aperture 122, extending along the channel.

The invention has been carried out by the deposition of 17,000 Å of 7% phosphorous silicon glass using an AMS 2000 reactor; applying the contact pattern in photoresist and etching the contact pattern to a depth of about 7,000 Å using a Tegal 703 plasma oxide etcher and stripping the photoresist.

A layer of Shipley 1450 photoresist 22,000 Å thick was applied, exposed with the channel pattern for the first metallization layer and developed. The metal channels were etched using the Tegal 703 plasma oxide etcher with Freon $+O_2$ to a depth of 6,000 Å in the channels, simultaneously removing an additional 6,000 Å from the contacts.

A mixture of 7:1 buffered HF to water at 24° C. was then used to finish the channel etch to a depth of 10,000 Å and, at the same time, to finish and clear out the contact apertures. An aluminum layer 10,000 Å thick was sputtered onto the wafer with the resist intact.

The photoresist was stripped off in ultrasonically agitated acetone, lifting off the unwanted metal. There was a metal to glass step that had a worst-case value of 2,000 Å, where the metal penetrated a channel poorly. Most steps will be considerably less. The contact depressions were about 7,000 Å with smooth shoulders obtained from the reflow glass.

The use of the invention is by no means confined to a double-metal integrated circuit. A very important application is the provision of very narrow metallization strips of high quality for single or double level metallization.

At present, it is difficult to produce metal lines with a separation of two microns or less because of processing variations. One approach now used is to sputter metal on the wafer, then to cover the desired pattern with a thin line of photoresist and to etch away the unwanted metal outside the desired lines. Fluctuations in the photoresist, the uniformity of the metal and the speed of the etching process may result in corroded or broken metal lines. With a process according to the invention, the limitation is the stepping machine, not the etching process. With currently available equipment, it is possible to put down metal lines with a pitch of one and one-half microns comprising a line of one micron and a spacing on one-half micron.

Figure 5:
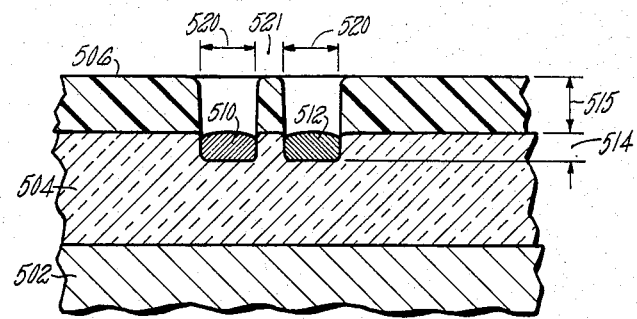
FIG. 5 illustrates a cross section of a small-pitch embodiment of the invention.

FIG. 5 shows a cross section of a pair of metal lines 510 and 512 embedded in a glass dielectric 504 placed on substrate 502. The metal lines have a thickness 514 of 0.6 micron and a width 520 of 1.0 micron. They are separated by a spacing 521 of 0.5 micron. Apertures for the metal have been opened through photoresist 506, having thickness 515 of 1.0 micron. This cross section has been drawn through an area that does not have steps or contacts, which would be handled as disclosed above. Wet or plasma etching may be used, singlely or in combination, depending on the degree of undercutting that may be tolerated and the danger of substrate damage.

The invention may be practiced with e-beam exposure and/or multi-layer photoresists in order to achieve the sharpest resolution.

The process is not confined to aluminum and may be used with any of a number of metals, such as zinc compounds, nickel alloys, iron alloys, gold, tungsten or tantalum. It may also be used with non-metallic conductors, such as polysilicon, polycides or silicides. The choice of conductor will depend on the usual thermal and other considerations of compatability with the rest of the processing steps.

We claim:

1. A method of forming a patterned layer of conductor on an integrated circuit comprising the steps of:
   depositing a first dielectric layer of predetermined dielectric thickness above at least one lower layer;
   depositing a contact layer of photoresist above said dielectric layer;
   exposing and developing said contact photoresist to form at least one contact aperture in said contact photoresist;
   removing that portion of said dielectric lying below said at least one contact aperture to a first contact depth; and
   stripping said contact photoresist;
   depositing a layer of conductor photoresist having a predetermined conductor photoresist thickness above said dielectric layer;
   exposing and developing said conductor photoresist to form at least one conductor aperture, overlapping said at least one contact aperture, in an overlap region, in said photoresist and a remainder portion of said photoresist outside said at least one conductor aperture;
   removing that portion of said dielectric lying below said at least one conductor aperture to a predetermined channel depth, thereby forming at least one channel having first and second sides in said dielectric, and also simultaneously removing a portion of dielectric in said overlap region to a second contact depth;
   depositing a layer of conductor over said integrated circuit, said layer of conductor having a predetermined conductor thickness substantially equal to said predetermined channel depth, so that a portion of said layer of metal penetrates said overlap region and penetrates said channel to abut said first and second sides and so that said layer of conductor is discontinuous between said at least one channel and said remainder of said photoresist; and
   lifting off chemically said remainder of said photoresist, thereby leaving a patterned layer of conductor embedded in said at least one channel in said dielectric layer.

2. A method according to claim 1, in which said conductor is a metal.

3. A method according to claim 1 including, after said step of removing that portion of said dielectric lying below said at least one conductor aperture, the further step of removing by wet etching that portion of said dielectric below said overlap region until a selected portion of said at least one lower layer is reached whereby electrical contact is made between said selected portion of said at least one lower layer and a portion of said embedded layer of conductor in said at least one channel.

4. A method according to claim 1, in which said steps of removing said portion of dielectric lying below said at least one contact aperture and said step of removing said portion of dielectric lying below said at least one conductor aperture are effected by plasma etching.

* * * * *